(12) United States Patent
Kaihara

(10) Patent No.: US 9,750,146 B2
(45) Date of Patent: Aug. 29, 2017

(54) PORTABLE DEVICE

(71) Applicant: KABUSHIKI KAISHA TOKAI RIKA DENKI SEISAKUSHO, Aichi (JP)

(72) Inventor: Kenji Kaihara, Aichi (JP)

(73) Assignee: KABUSHIKI KAISHA TOKAI RIKA DENKI SEISAKUSHO, Aichi (JP)

( * ) Notice: Subject to any disclaimer, the term of this patent is extended or adjusted under 35 U.S.C. 154(b) by 0 days.

(21) Appl. No.: 15/296,315

(22) Filed: Oct. 18, 2016

(65) Prior Publication Data

US 2017/0127541 A1    May 4, 2017

(30) Foreign Application Priority Data

Oct. 30, 2015  (JP) ................................ 2015-215157

(51) Int. Cl.
| | |
|---|---|
| H05K 5/00 | (2006.01) |
| H05K 5/02 | (2006.01) |
| B60R 25/24 | (2013.01) |
| G07C 9/00 | (2006.01) |

(52) U.S. Cl.
CPC ........... *H05K 5/0052* (2013.01); *B60R 25/24* (2013.01); *H05K 5/006* (2013.01); *H05K 5/0013* (2013.01); *G07C 9/00309* (2013.01); *G07C 2009/00984* (2013.01)

(58) Field of Classification Search
CPC ..... H05K 5/0052; H05K 5/006; H05K 5/0013
USPC ........................................ 361/752, 759, 814
See application file for complete search history.

(56) References Cited

U.S. PATENT DOCUMENTS

| | | | | |
|---|---|---|---|---|
| 5,946,395 | A | * | 8/1999 | Petrella ............... H04M 1/0249 379/433.01 |
| 5,955,700 | A | * | 9/1999 | Slipy ................... H01M 2/1055 174/50 |
| 6,111,760 | A | * | 8/2000 | Nixon .................. H04B 1/3833 220/4.02 |

(Continued)

FOREIGN PATENT DOCUMENTS

| | | |
|---|---|---|
| EP | 2 924 664 | 9/2015 |
| JP | 2013-19224 | 1/2013 |

(Continued)

OTHER PUBLICATIONS

Extended European Search Report in EP Appl. No. 16 19 5477.1 dated Mar. 17, 2017.

*Primary Examiner* — Sherman Ng
(74) *Attorney, Agent, or Firm* — Greenblum & Bernstein, P.L.C.

(57) ABSTRACT

A portable device includes a circuit board, a first member, and a second member. The circuit board is held and fastened between the first member and the second member. The first member includes a wall that extends toward the second member from the first member. The second member includes an engaging portion. The engaging portion includes an extension, which extends toward the first member from the second member, and a hook, which projects from the extension in a direction extending along an end surface of the circuit board. The portable device further includes an engaged portion located along an inner side of the wall. Engagement of the engaged portion with the hook of the engaging portion fastens the first member to the second member.

6 Claims, 8 Drawing Sheets

(56) References Cited

U.S. PATENT DOCUMENTS

| | | | |
|---|---|---|---|
| 7,081,691 B2 * | 7/2006 | Kawata | H05K 1/0203 307/9.1 |
| 2014/0285987 A1 * | 9/2014 | Nagashima | H05K 7/12 361/759 |

FOREIGN PATENT DOCUMENTS

| | | |
|---|---|---|
| KR | 10-2008-0075783 | 8/2008 |
| WO | 2015/104747 | 7/2015 |

* cited by examiner

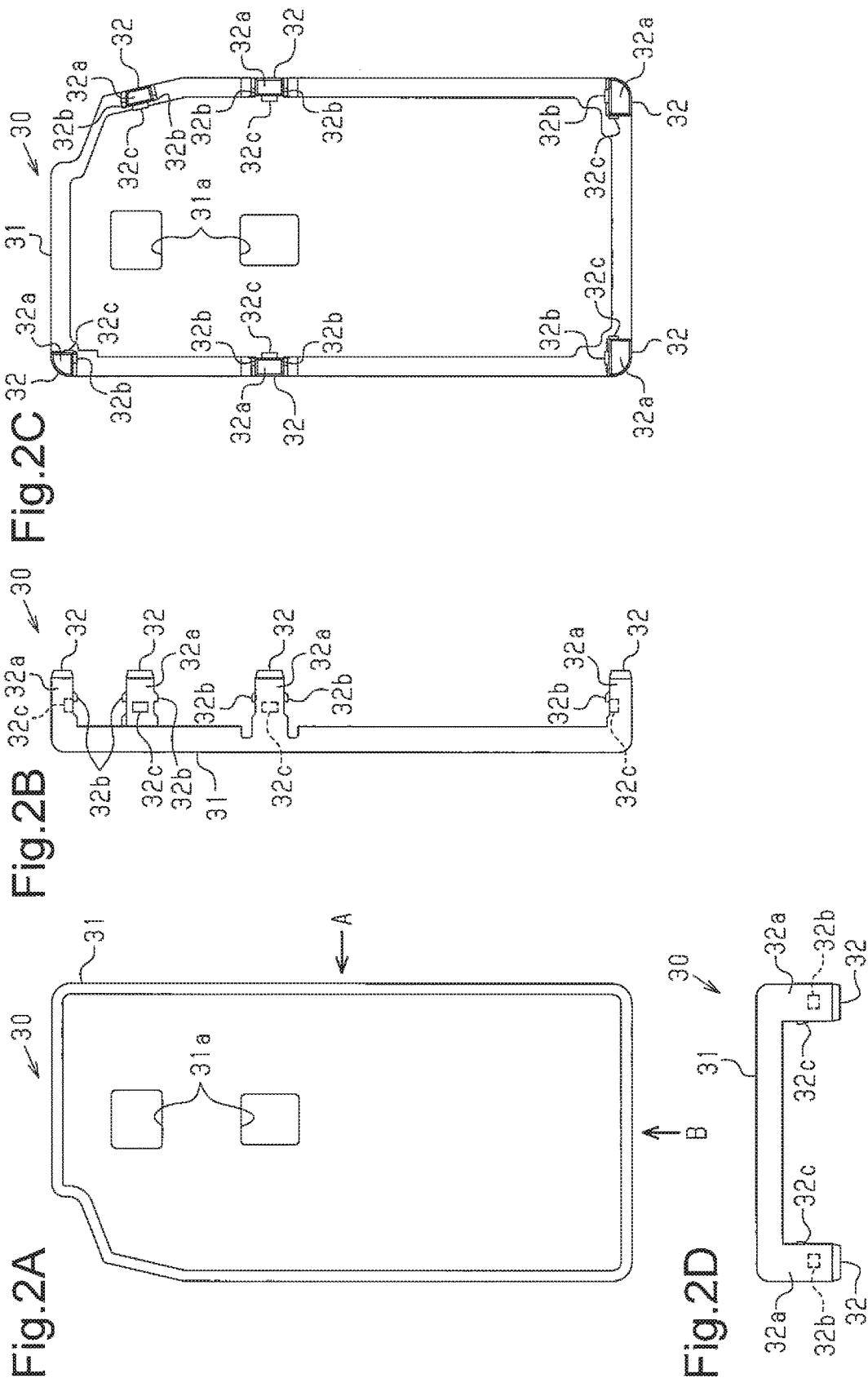

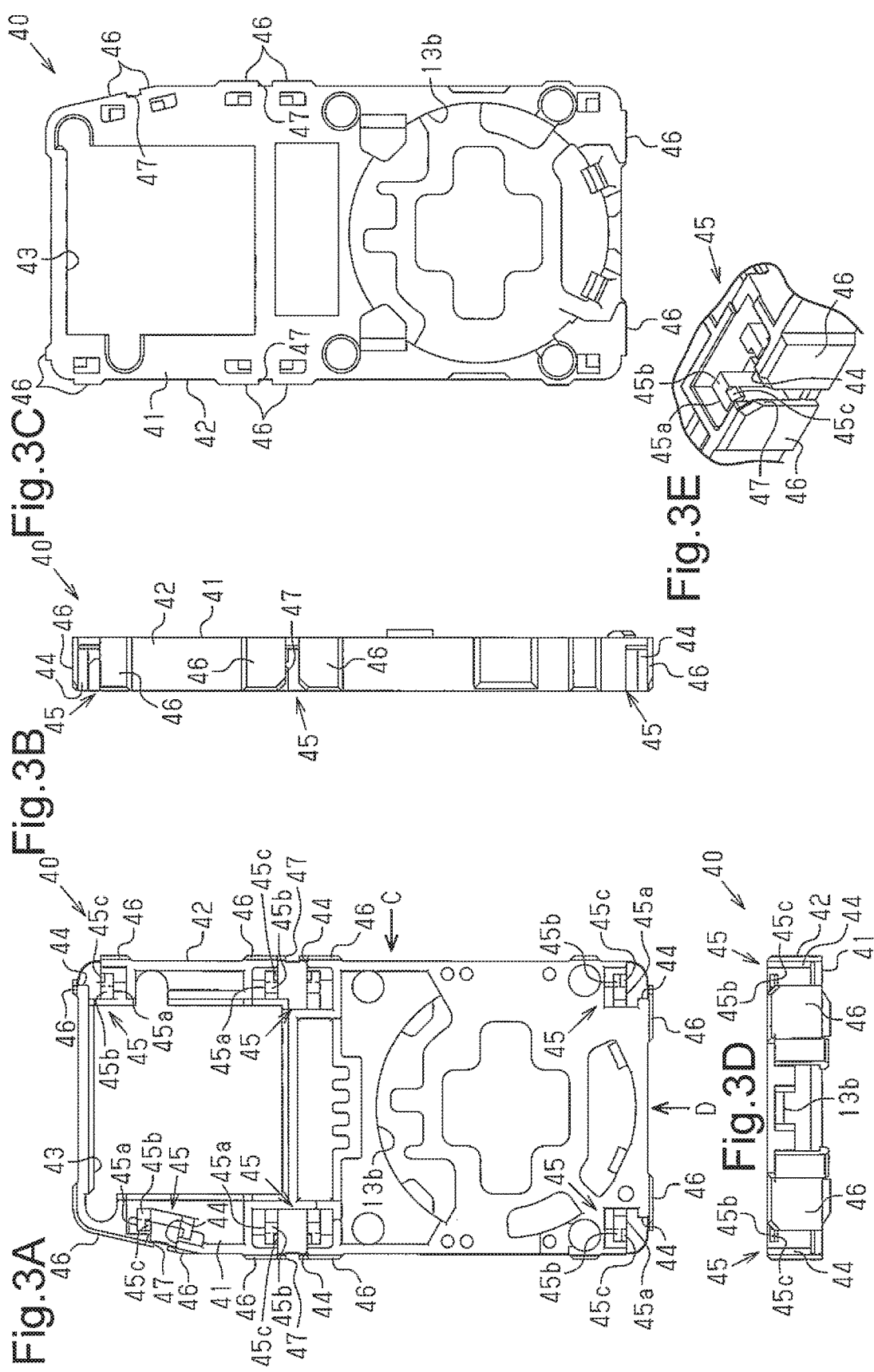

PORTABLE DEVICE

CROSS-REFERENCE TO RELATED APPLICATIONS

This application is based upon and claims the benefit of priority from prior Japanese Patent Application No. 2015-215157, filed on Oct. 30, 2015, the entire contents of which are incorporated herein by reference.

FIELD

This disclosure relates to a portable device.

BACKGROUND

To improve convenience when operating a vehicle, a portable device for operating the vehicle is used in an electronic key system. Japanese Laid-Open Patent Publication No. 2013-19224 describes a portable device including electronic components such as a circuit board and a battery. The feature of the portable device is in how the circuit board is accommodated in the portable device.

In the portable device of the above publication, the circuit board, which includes a surface on which circuit elements are mounted, is held between a protection cover and a battery holder. Thus, the entire circuit board is concealed by the protection cover and the battery holder. The protection cover includes projections, each including an engagement hook. The engagement hook of the protection cover is snap-fitted to a corresponding groove located in an outer wall of the battery holder. This couples the protection cover to the battery holder. The engagement hook extends from the corresponding projection of the protection cover toward the circuit board. The protection cover includes a guard plate at the rear of each projection (engagement hook). The guard plate covers the projection so that the engagement hook cannot be seen from the exterior when the protection cover is coupled to the battery holder.

Many circuit elements and wires that connect the circuit elements are mounted on the circuit board. Thus, the circuit board needs sufficient space for a circuit area where the circuit elements and the wires are mounted. To miniaturize the protection cover and the battery holder, each guard plate will have to be located at a further inner position on the protection cover. In such a case, the projection (particularly, engagement hook) of the protection cover will partially occupy and reduce the size of the circuit area for the circuit elements and the wires. To enlarge the circuit area for the circuit elements and the wires, each projection (engagement hook) and the corresponding guard plate will have to be located at a further outer position on the protection cover. This will enlarge the protection cover and the battery holder. Therefore, there is a trade-off between the miniaturization of the protection cover and the battery holder and the enlargement of the circuit area for the circuit elements and the wires.

SUMMARY

One embodiment is a portable device that includes a circuit board on which a circuit element is mounted, a first member, and a second member. The circuit board is held and fastened between the first member and the second member. The first member includes a wall that extends toward the second member from the first member. The second member includes an engaging portion. The engaging portion includes an extension that extends toward the first member from the second member and a hook that projects from the extension. The circuit board includes an end surface that defines an edge of the circuit board. The extension is opposed to the end surface of the circuit board. The hook projects from the extension in a direction that extends along the end surface of the circuit board. The portable device further includes an engaged portion located along an inner side of the wall. The engaged portion engages the engaging portion to fasten the first member to the second member.

Other embodiments and advantages thereof will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIG. 2A is a front view illustrating a protection cover of the portable device;

FIG. 2B is a side view of the protection cover illustrated in FIG. 2A taken in the direction indicated by arrow A;

FIG. 2C is a rear view of the protection cover illustrated in FIG. 2A;

FIG. 2D is a side view of the protection cover illustrated in FIG. 2A taken in the direction indicated by arrow B;

FIG. 3A is a front view illustrating a first embodiment of a battery holder;

FIG. 3B is a side view of the battery holder illustrated in FIG. 3A taken in the direction indicated by arrow C;

FIG. 3C is a rear view of the battery holder illustrated in FIG. 3A;

FIG. 3D is a side view of the battery holder illustrated in FIG. 3A taken in the direction indicated by arrow D;

FIG. 3E is an enlarged perspective view illustrating an engaged portion of the battery holder illustrated in FIG. 3A;

DESCRIPTION OF THE EMBODIMENTS

First Embodiment

A first embodiment of a portable device will now be described. The portable device of the first embodiment is, for example, an electronic key that is used for operating a vehicle in the electronic key system for the vehicle. When receiving a transmission signal from a vehicle controller installed in the vehicle, the electronic key performs wireless communication with the vehicle controller. The electronic key performs ID verification of the electronic key through short range communication with the vehicle controller and operates the vehicle, for example, locks or unlocks doors of the vehicle based on the result of ID verification.

Figure 1:
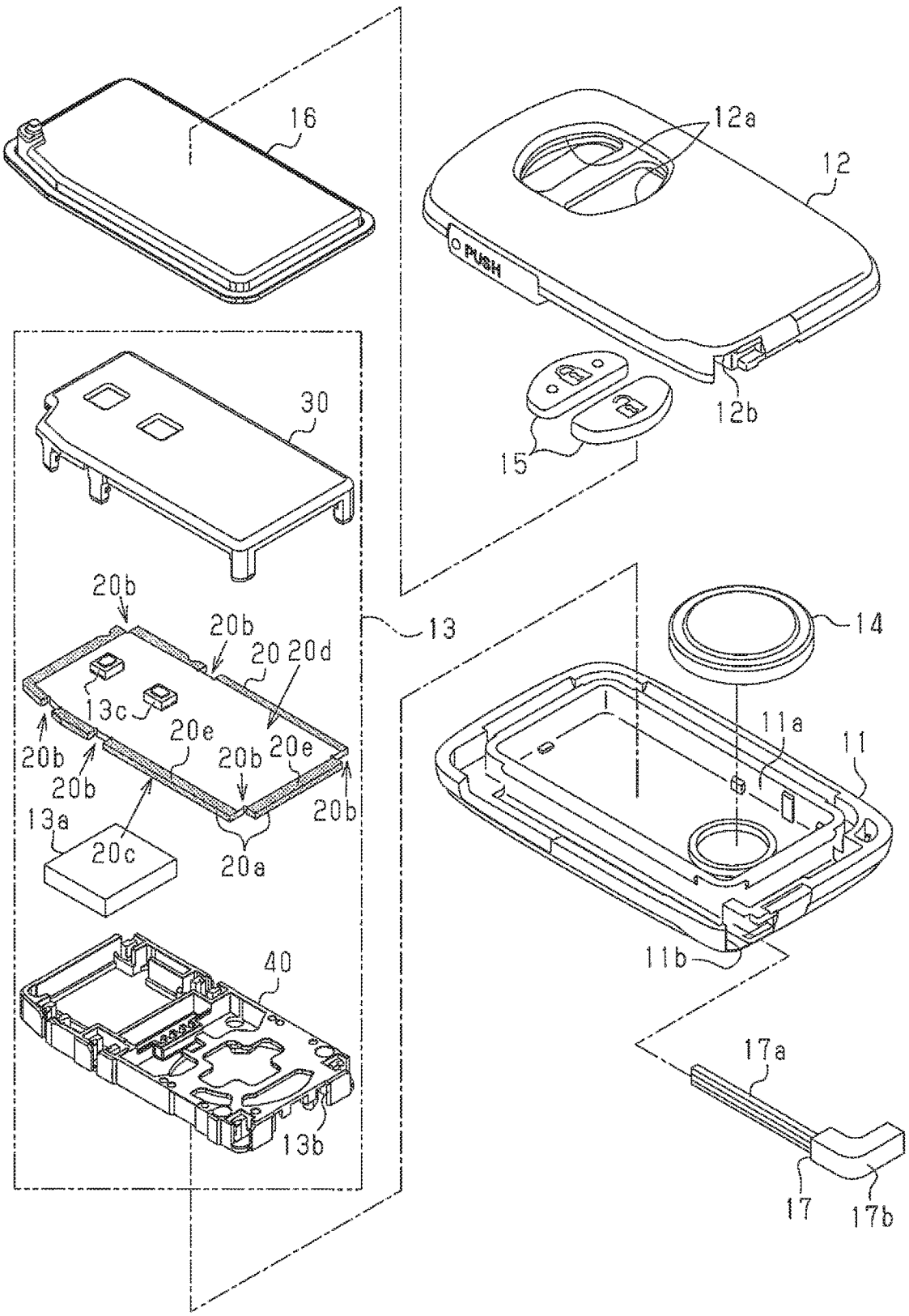
FIG. 1 is an exploded perspective view illustrating the schematic structure of a portable device.

As illustrated in FIG. 1, the electronic key includes a lower case 11 and an upper case 12, which is fastened to the lower case 11. Each of the lower case 11 and the upper case 12 is resin-molded and rectangular and includes two long sides and two short sides. When the lower case 11 is fastened to the upper case 12, the electronic key is box-shaped.

A board unit 13 is accommodated in the electronic key, that is, between the lower case 11 and the upper case 12. A circuit element 13a, which enables a communication function or the like, is mounted on the board unit 13. Although FIG. 1 illustrates only one circuit element 13a, a plurality of circuit elements may be mounted on the board unit 13. The board unit 13 is fastened to a unit receptacle 11a formed in the lower case 11. The board unit 13 includes a battery receptacle 13b, which accommodates a cylindrical (button-type) battery 14.

The board unit 13 also includes a plurality (in present example, two) of square switches 13c, which are arranged in the longitudinal direction of the electronic key. When each switch 13c is exposed from the board unit 13 toward the upper case 12, the switch 13c is accommodated in the electronic key.

The electronic key also accommodates a plurality of pushing members 15, each of which has the form of a semicircular plate. In the present example, the electronic key includes two pushing members 15, the number of which is the same as the number of the switches 13c. The upper case 12 includes a plurality of semicircular through holes 12a. In the present example, the upper case 12 includes two through holes 12a, the number of which is the same as the number of the pushing members 15. The pushing members 15 are inserted from an inner side of the upper case 12 through the through holes 12a. When the pushing members 15 are exposed out of the upper case 12 (i.e., electronic key), the pushing members 15 are accommodated in the electronic key. The two pushing members 15 are located at positions overlapping with the two switches 13c in the thickness-wise direction of the electronic key (vertical direction in FIG. 1). When each pushing member 15 is pushed from outside the electronic key, the corresponding switch 13c is activated to enable the vehicle operation.

A water guard 16 is located between each switch 13c and each pushing member 15. The water guard 16 is molded from a resin such as silicone and rectangular and includes two long sides and two short sides. The water guard 16 is arranged to conceal the entire exposed portion of the board unit 13 when the board unit 13 is accommodated in the unit receptacle 11a and held between the water guard 16 and the lower case 11. The water guard 16 prevents entrance of foreign matter such as water or dust from the through holes 12a in the upper case 12.

Additionally, a mechanical key 17 is accommodated between the lower case 11 and the upper case 12. In the present example, the lower case 11 includes a lower side groove 11b, and the upper case 12 includes an upper side groove 12b. The lower side groove 11b and the upper side groove 12b define a key accommodation hole. The mechanical key 17 includes a key groove portion 17a having the form of an elongated plate. The key groove portion 17a is accommodated in the key accommodation hole. The mechanical key 17 includes a handle 17b, which is exposed from the key accommodation hole. This allows the user to hold the handle 17b and draw the mechanical key 17 out of the electronic key. The user may use the mechanical key 17, which is drawn out of the electronic key, to manually operate the vehicle.

The structure of the board unit 13 will now be described in detail.

As illustrated in FIG. 1, the board unit 13 includes a circuit board 20, a protection cover 30, and a battery holder 40, each of which is rectangular and includes two long sides and two short sides. The circuit board 20 includes end surfaces 20a that define the edges of the rectangular circuit board 20. The end surfaces 20a include a plurality (in present example, six) of cutaway portions 20b. Each cutaway portion 20b is located in the periphery of the circuit board 20 at an intermediate position in a straight portion (in present example, long side) or in a corner (position where long side intersects short side) of the circuit board 20. The cutaway portions 20b define end portions 20e (indicated by shadings in FIG. 1) that are separated from one another in the end surfaces 20a of the circuit board 20.

The circuit board 20 includes a surface opposed to the battery holder 40 that defines a circuit area 20c and a surface opposed to the protection cover 30 that defines a switch area 20d. The circuit element 13a is mounted on the circuit area 20c. The switches 13c are mounted on the switch area 20d. The circuit area 20c and the switch area 20d are located inward from the end portions 20e in a plan view.

When the circuit board 20 is held between the protection cover 30 and the battery holder 40, the protection cover 30 is fastened to the battery holder 40. This unitizes the circuit board 20, the protection cover 30, and the battery holder 40 as one board unit 13. In the present example, the end portions 20e of the circuit board 20 are held between the protection cover 30 and the battery holder 40. In the first embodiment, the battery holder 40 is one example of a first member, and the protection cover 30 is one example of a second member.

The structure of the protection cover 30 will now be described in detail.

As illustrated in FIGS. 2A to 2D, the protection cover 30 includes a plate 31. The plate 31 includes end surfaces that define the edges of the plate 31. In the board unit 13, the end surfaces of the plate 31 are substantially flush with the corresponding end surfaces 20a of the circuit board 20. Thus, the plate 31 and the circuit board 20 have substantially the same size in a plan view (refer to FIGS. 4A to 5C). The plate 31 includes a plurality (in present example, two) of through holes 31a. As described above, the through holes 31a are located at positions corresponding to the switches 13c, which are mounted on the circuit board 20.

The protection cover 30 includes a plurality (in present example, six) of engaging portions 32. In the board unit 13, the engaging portions 32 project from the periphery of the plate 31 toward the battery holder 40 (refer to FIG. 4B). The engaging portions 32 are spaced apart from one another and located at positions corresponding to the cutaway portions 20b of the circuit board 20. Each engaging portion 32 may be fitted to the corresponding cutaway portion 20b. The length of each engaging portion 32 is set to be greater than the thickness of the circuit board 20. The battery holder 40 includes a plate 41, which comes into contact with the distal end of each engaging portion 32 when the protection cover 30 is coupled to the battery holder 40 (refer to FIG. 5C).

Figure 4B:
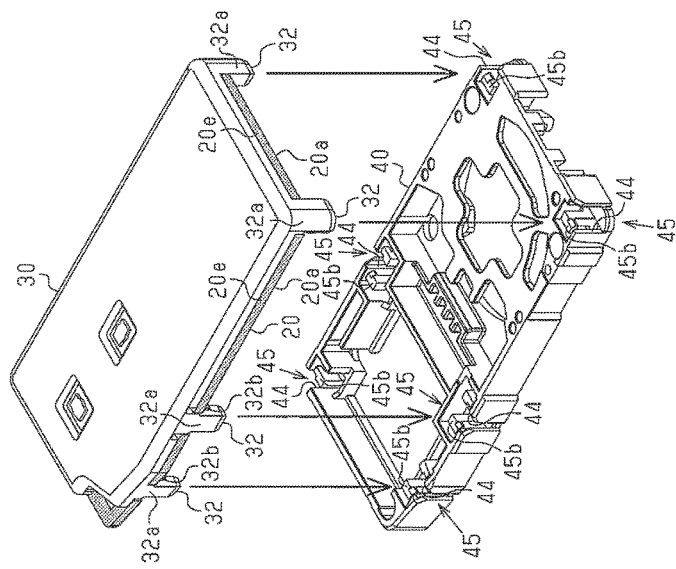
FIGS. 4A and 4B are perspective views illustrating the procedures for unitizing a circuit board, the protection cover, and the battery holder.
Figure 4A:
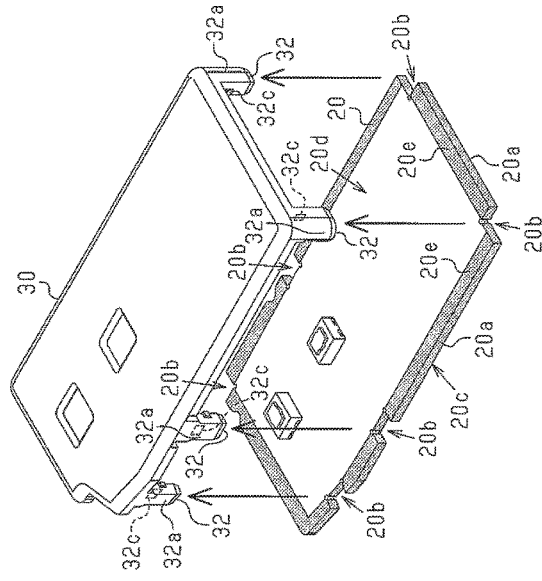

As illustrated in FIGS. 2B to 2D, each engaging portion 32 includes an extension 32a, which extends from the periphery of the plate 31 in the thickness-wise direction of the plate 31, and a first hook 32b, which projects from the extension 32a in a direction extending along the periphery of the plate 31. In the present example, each engaging portion 32 further includes a second hook 32c, which projects from the extension 32a toward an inner side of the plate 31. As illustrated in FIGS. 4A and 4B, in the board unit 13, the extensions 32a extend from the protection cover 30 toward the battery holder 40, and the first hooks 32b project in a direction extending along the corresponding end surfaces 20a of the circuit board 20.

In the present example, the engaging portions 32 include first engaging portions 32, each of which includes a plurality of first hooks 32b, and second engaging portions 32, each of which includes a single first hook 32b. As illustrated in FIG. 2C, for example, three first engaging portions 32 and three second engaging portions 32 are arranged along the periphery of the plate 31. The first engaging portions 32 are located in the periphery of the plate 31 at straight portions (in present example, two long sides). Each first engaging portion 32 includes two first hooks 32b, which project from opposite sides of the extension 32a in a direction extending along the corresponding edge of the plate 31 (i.e., corresponding end surface 20a of circuit board 20).

The second engaging portions 32 are located in the periphery of the plate 31 at corners (in present example, three corners). Each second engaging portion 32 includes a single first hook 32b, which projects from one side of the extension 32a in a direction extending along the corresponding edge of the plate 31 (i.e., corresponding end surface 20a of circuit board 20).

As illustrated in FIGS. 2B and 2C, each first engaging portion 32 includes a single second hook 32c. As illustrated in FIGS. 2B to 2D, each second engaging portion 32 also includes a single second hook 32c. The second hook 32c is located closer to the base of the engaging portion 32 (i.e., plate 31) than each first hook 32b. Additionally, the second hook 32c is separated from the base of the engaging portion 32 by a distance corresponding to the thickness of the circuit board 20.

The structure of the battery holder 40 will now be described in detail.

As illustrated in FIGS. 3A to 3D, the battery holder 40 includes the plate 41. The plate 41 includes end surfaces that define the edges of the plate 41. In the board unit 13, the end surfaces of the plate 41 are substantially flush with the corresponding end surfaces 20a of the circuit board 20 and the corresponding end surfaces of the protection cover 30 (plate 31). Thus, the plate 41, the circuit board 20, and the protection cover 30 (plate 31) have substantially the same size in a plan view (refer to FIGS. 4A to 5C). In the board unit 13, the battery holder 40 includes walls 42, which extend from the periphery of the plate 41 toward the protection cover 30. The plate 41 includes a through hole 43 that occupies one longitudinal half of the plate 41 and the battery receptacle 13b that occupies the other longitudinal half of the plate 41.

The battery holder 40 includes a plurality (in present example, six) of engaged portions 45, which are arranged along inner sides of the walls 42. The engaged portions 45 are spaced apart from one another and located at positions corresponding to the cutaway portions 20b of the circuit board 20, that is, the engaging portions 32 of the protection cover 30. Engagement of the engaging portions 32 with the engaged portions 45 fastens the protection cover 30 to the battery holder 40.

As illustrated in FIGS. 3A, 3E, 4B, 6, each engaged portion 45 includes a post 45a, which extends from the plate 41 in the thickness-wise direction of the plate 41, and a catch 45b, which extends from the distal end (upper end) of the post 45a toward the corresponding wall 42. More specifically, each engaged portion 45 is L-shaped by the post 45a and the hook catch 45b. The distal end of the hook catch 45b includes an inclined surface 45c, which is inclined from the hook catch 45b toward the base (lower end) of the post 45a. The hook catch 45b, which extends from the post 45a toward the wall 42, is set to a length such that the distal end of the hook catch 45b will not come into contact with the wall 42.

The engaged portions 45 include first engaged portions 45, each of which includes a plurality (in present example, two) of posts 45a and a plurality (in present example, two) of hook catches 45b, and second engaged portions 45, each of which includes a single post 45a and a single hook catch 45b. As illustrated in FIG. 3A, for example, three first engaged portions 45 and three second engaged portions 45 are located inward from the walls 42 along the periphery of the plate 41. The first engaged portions 45 are located in the periphery of the plate 41 at straight portions (in present example, two long sides). The two posts 45a (two hook catches 45b) of each first engaged portion 45 are located adjacent to each other in the direction extending along the periphery of the plate 41. The distance between the two hook catches 45b of the first engaged portion 45 is set to be shorter than the distance between the distal ends of the two first hooks 32b of each first engaging portion 32 (refer to FIG. 5A).

The second engaged portions 45 are located in the periphery of the plate 41 at corners (in present example, three corners). As described above, each second engaged portion 45 includes the single post 45a and the single hook catch 45b.

As illustrated in FIGS. 3A, 3B, 3D, 3E, the walls 42 of the battery holder 40 include slits 44 at positions adjacent to the engaged portions 45. Each slit 44 extend through the corresponding wall 42 from the upper end to the lower end (plate 41) in a direction in which the extension 32a of the corresponding engaging portion 32 extends. When each engaging portion 32 engages the corresponding engaged portion 45, a portion of the extension 32a (portion of outer wall) is fitted to the slit 44. In the present example, the slit 44 defines a portion of the engaged portion 45.

As illustrated in FIGS. 3A to 3E, thick portions 46 are located outward from the walls 42 in correspondence with the slits 44 (engaged portions 45). Each thick portion 46 is one example of a support portion and formed by a portion of the corresponding wall 42. The thick portion 46 is formed, for example, by increasing the thickness of the wall 42. When the board unit 13 (battery holder 40) is accommodated in the lower case 11, the thick portions 46 are in contact with inner walls of the unit receptacle 11a. Each thick portion 46 functions as a position stabilizer, which stably fastens the board unit 13 to the unit receptacle 11*a*. In the present example, the thick portions 46 are also located outward from the walls 42 at positions that are free from the slits 44 (engaged portions 45).

Figure 6:
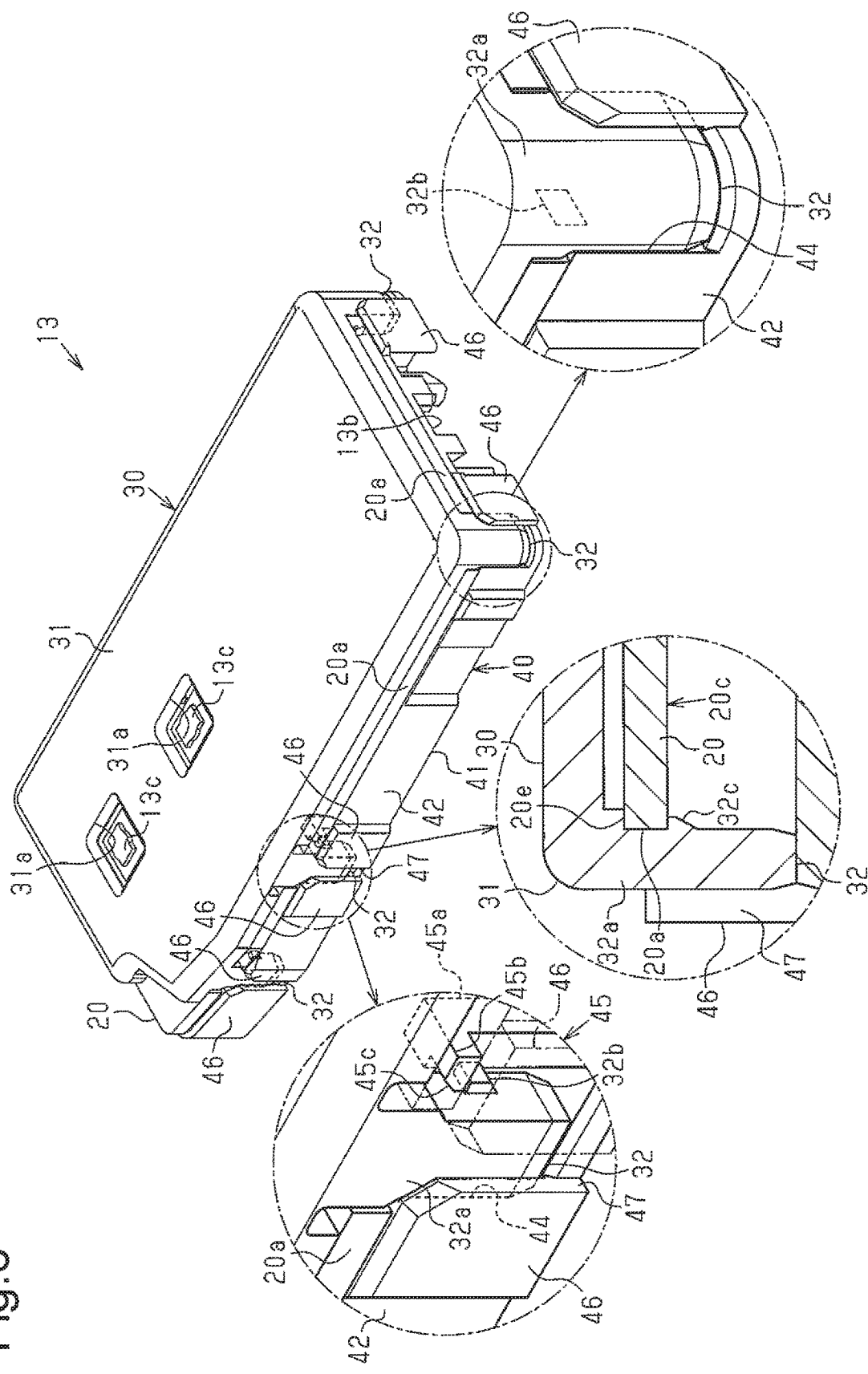
FIG. 6 is a perspective view illustrating a board unit of the first embodiment.
Figure 7:
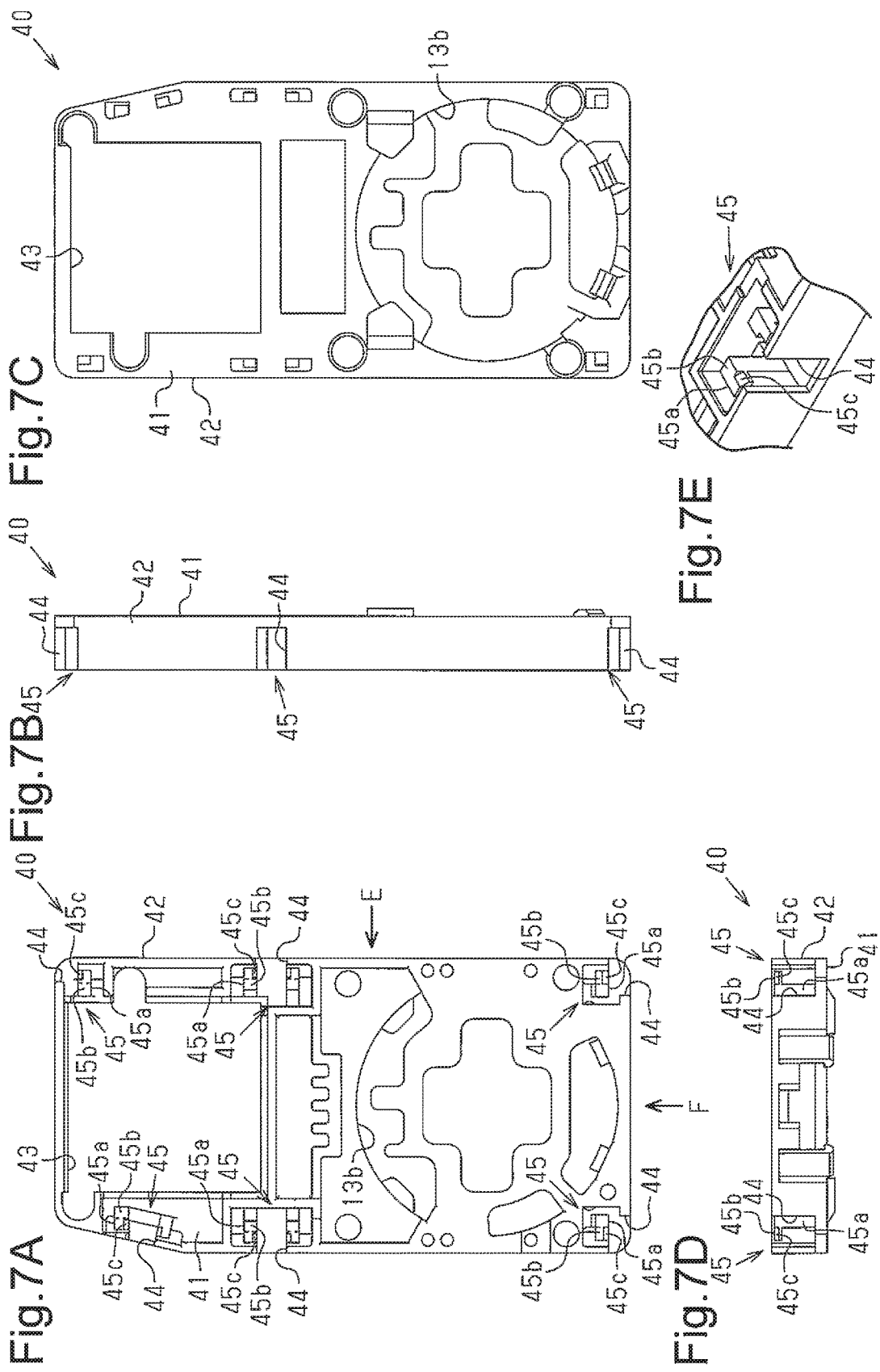
FIG. 7A is a front view illustrating a second embodiment of a battery holder.
FIG. 7B is a side view of the battery holder illustrated in FIG. 7A taken in the direction indicated by arrow E.
FIG. 7C is a rear view of the battery holder illustrated in FIG. 7A.
FIG. 7D is a side view of the battery holder illustrated in FIG. 7A taken in the direction indicated by arrow F.
FIG. 7E is an enlarged perspective view illustrating an engaged portion of the battery holder illustrated in FIG. 7A.

As illustrated in FIGS. 3A, 3E, 6, each of the thick portions 46 located at the first engaged portions 45 conceals opposite edges defining the slit 44 and opposite ends of the outer wall of the first engaging portion 32 (extension 32*a*) in a direction extending along the corresponding end surface 20*a* of the circuit board 20. In other words, the thick portions 46 located at the first engaged portions 45 each include a gap 47 that exposes a central portion of the outer wall of the first engaging portion 32 (extension 32*a*). As illustrated in FIGS. 3A and 6, each of the thick portions 46 located at the second engaged portions 45 conceals one of edges defining the slit 44 and a portion of the outer wall of the second engaging portion 32 (extension 32*a*). The first hook 32*b* of the second engaging portion 32 and the corresponding thick portion 46 are located at opposite sides of the extension 32*a* of the second engaging portion 32.

The procedures for unitizing the circuit board 20, the protection cover 30, and the battery holder 40 as the board unit 13 will now be described.

As illustrated in FIG. 4A, the circuit board 20 is coupled to the protection cover 30. When the circuit board 20 is coupled to the protection cover 30, the extensions 32*a* of the engaging portions 32 are opposed to the end surfaces 20*a* of the circuit board 20. Also, each engaging portion 32 is inserted into the corresponding cutaway portion 20*b*. At this time, when the protection cover 30 is located proximate to the circuit board 20, the second hook 32*c* of each engaging portion 32 comes into contact with one surface (switch area 20*d*) of the circuit board 20 at the corresponding cutaway portion 20*b*. Then, when the circuit board 20 is pressed to the protection cover 30, the engaging portions 32 elastically deform, and the second hooks 32*c* of the engaging portions 32 are moved to the other surface (circuit area 20*c*) of the circuit board 20. Consequently, when the circuit board 20 is coupled to the protection cover 30, the second hooks 32*c* of the engaging portions 32 are hooked on the edges of the circuit board 20 to support the circuit board 20. In this state, the plate 31 of the protection cover 30 is in contact with the end portions 20*e* of the circuit board 20 between adjacent ones of the engaging portions 32. The second hook 32*c* of each engaging portion 32 functions as a temporary fastening hook, which temporarily fastens the circuit board 20 to the protection cover 30.

As illustrated in FIG. 4B, the protection cover 30, to which the circuit board 20 is temporarily fastened, is coupled to the battery holder 40. At this time, the engaging portions 32 of the protection cover 30 are inserted into the engaged portions 45 of the battery holder 40 and the slits 44 of the walls 42. Then, when the protection cover 30 is pressed to the battery holder 40, the first hooks 32*b* of the engaging portions 32 are hooked on the hook catches 45*b* of the engaged portions 45. This fastens the protection cover 30 to the battery holder 40. In this state, the battery holder 40 is in contact with the end portions 20*e* of the circuit board 20 between adjacent ones of the engaged portions 45. As described above, engagement of the first hooks 32*b* of the engaging portions 32 with the engaged portions 45 fastens the protection cover 30 to the battery holder 40. Thus, each first hook 32*b* functions as a main fastening hook, which ultimately fastens the circuit board 20 to the protection cover 30 and the battery holder 40.

Figure 5A:
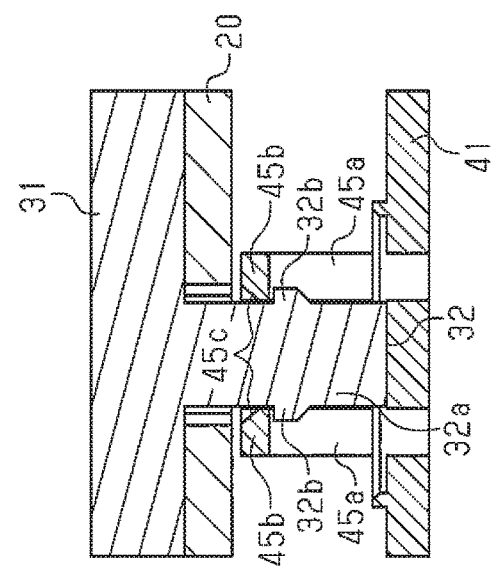
FIGS. 5A to 5C are cross-sectional views illustrating movements of an engaging portion and the engaged portion when the protection cover is fastened to the battery holder.
Figure 5B:
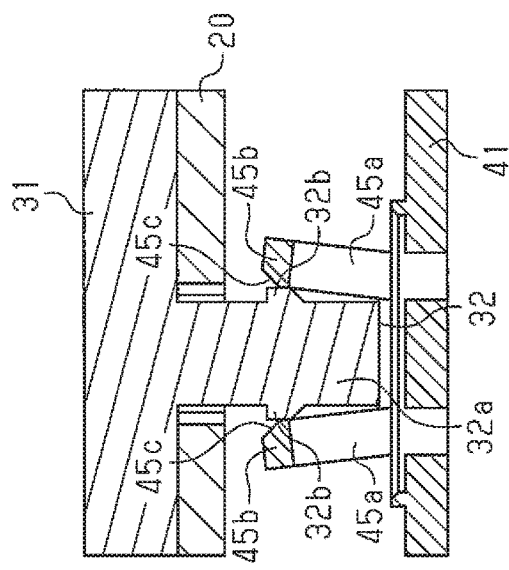
Figure 5C:
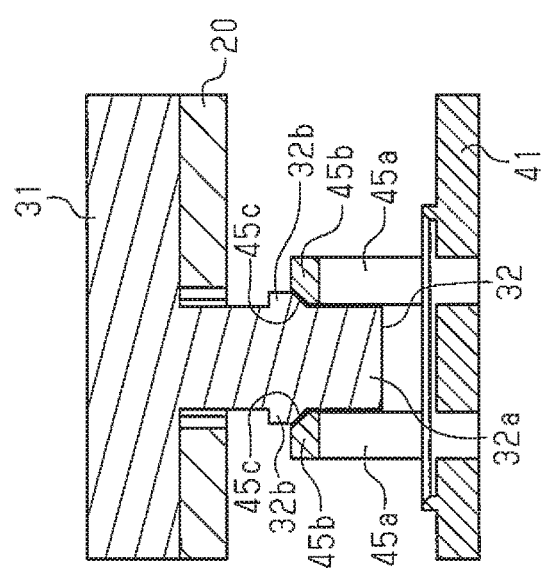

The operation of the engagement of the first engaging portions 32 of the protection cover 30 with the first engaged portions 45 of the battery holder 40 will now be described with reference to FIGS. 5A to 5C. As illustrated in FIG. 5A, the distal end of the extension 32*a* of the first engaging portion 32 is inserted into the gap between the two hook catches 45*b* of the first engaged portion 45. The first hooks 32*b* come into contact with the inclined surfaces 45*c* of the corresponding hook catches 45*b*. At this time, the outer wall of the extension 32*a* is partially fitted into the slit 44 of the wall 42 (refer to FIG. 6). As illustrated in FIG. 5B, when the first engaging portion 32 is further inserted into the first engaged portion 45, the first hooks 32*b* press the inclined surfaces 45*c* of the hook catches 45*b* to move the two hook catches 45*b* away from each other. Accordingly, the two posts 45*a* elastically deform to separate away from each other. As illustrated in FIG. 5C, when the first hooks 32*b* pass by the hook catches 45*b* (inclined surfaces 45*c*), the posts 45*a* recover from the elastic deformation, and the first hooks 32*b* are hooked on the hook catches 45*b*. In this state, the distal end of the extension 32*a* is in contact with the plate 41 of the battery holder 40. Although not described, the second engaging portions 32 engage the second engaged portions 45 in the same manner as the engagement of the first engaging portions 32 with the first engaged portions 45. Additionally, the outer wall of the extension 32*a* of each second engaging portion 32 is partially inserted into the corresponding slit 44 in the walls 42 (refer to FIG. 6). In this manner, the protection cover 30 is fastened to the battery holder 40.

Consequently, as illustrated in FIG. 6, the circuit board 20 is ultimately fastened to the protection cover 30 and the battery holder 40. The circuit board 20, the protection cover 30, and the battery holder 40 are unitized as one board unit 13.

Referring to FIG. 6 (left enlarged perspective view and center enlarged cross-sectional view), the extension 32*a* of each engaging portion 32 is opposed to the corresponding end surface 20*a* of the circuit board 20. Also, referring to FIG. 6 (left enlarged perspective view), the one or two first hooks 32*b* of each engaging portion 32 project in a direction extending along the corresponding end surface 20*a* of the circuit board 20. As illustrated in FIG. 6 (left enlarged perspective view), the thick portion 46 located at the first engaging portion 32 conceals opposite edges defining the slit 44 and opposite ends of the outer wall of the extension 32*a* in the direction extending along the corresponding end surface 20*a* of the circuit board 20, and the remaining portion (central portion) of the outer wall of the extension 32*a* is exposed through the slit 44 and the gap 47 formed in the thick portion 46. As illustrated in FIG. 6 (right enlarged perspective view), the thick portion 46 located at the second engaging portion 32 conceals one edge defining the slit 44 and a portion of the outer wall of the extension 32*a,* and the remaining portion of the outer wall of the extension 32*a* is exposed through the slit 44. That is, the outer wall of the extension 32*a* of the second engaging portion 32 is partially covered by the thick portion 46 located at the side of the second engaging portion 32 opposite to the side where the first hook 32*b* is located. Each first hook 32*b,* more specifically, the engagement state of each first hook 32*b* with the corresponding hook catch 45*b,* is concealed from the exterior by the walls 42 or the thick portions 46. Referring to FIG. 6 (center enlarged cross-sectional view), the second hooks 32*c* of the engaging portions 32 are hooked on the edges of the circuit board 20 to support the circuit board 20.

In the board unit 13, each switch 13c is exposed through the corresponding through hole 31a in the protection cover 30. The circuit element 13a is exposed through the through hole 43 (refer to FIG. 3A) in the battery holder 40.

The operation of the first embodiment of the portable device will now be described.

When the first hooks 32b of the engaging portions 32 of the protection cover 30 engage the engaged portions 45 of the battery holder 40, the protection cover 30 is fastened to the battery holder 40. This fastens the circuit board 20 to the protection cover 30 and the battery holder 40. The one or two first hooks 32b of each engaging portion 32 do not project toward the circuit board 20 but project in a direction extending along the corresponding end surface 20a of the circuit board 20. When the protection cover 30 is fastened to the battery holder 40, the first hooks 32b are concealed by the walls 42 or the thick portions 46 and are not exposed from the protection cover 30 and the battery holder 40 to the exterior.

This structure prevents the first hooks 32b from occupying the circuit area 20c of the circuit board 20 as compared to a structure in which engagement hooks that engage with the battery holder project toward the battery holder (e.g., structure in Japanese Laid-Open Patent Publication No. 2013-19224).

The protection cover 30 includes the first engaging portions 32, each of which includes a plurality of first hooks 32b, and the second engaging portions 32, each of which includes a single first hook 32b. More specifically, the number of the first hooks 32b is optimized in accordance with the position of each engaging portion 32. This optimizes the shapes of the protection cover 30 and the battery holder 40.

If, for example, a first engaging portion 32 that includes a plurality of first hooks 32b is located in a corner of the protection cover 30, the structure of the engaged portion 45 located at the corresponding corner of the battery holder 40 would be complicated. This complicates the structure of the battery holder 40 in addition to the structure of the protection cover 30.

In this regard, in the present example, as illustrated in FIG. 2C, the first engaging portions 32 are located in the periphery of the protection cover 30 at the straight portions (in present example, long sides). The second engaging portions 32 are located in the periphery of the protection cover 30 at the corners. Thus, the number of first hooks 32b is adjusted in accordance with the position of each engaging portion 32 to arrange different engaging portions 32 (first engaging portions 32, second engaging portions 32).

When each second engaging portion 32 is located in a corner of the protection cover 30, the coupling of the protection cover 30 to the battery holder 40 moves the second engaging portion 32 in a direction opposite to the direction in which the first hook 32b projects. More specifically, the second engaging portion 32 is separated from the second engaged portion 45 and may be disengaged from the second engaged portion 45.

In this regard, in the present example, the outer wall of the second engaging portion 32 (extension 32a) located in the corner of the protection cover 30 is partially covered by the thick portion 46 located at the side of the second engaging portion 32 opposite to the side where the first hook 32b is located. Thus, the thick portion 46 prevents the second engaging portion 32 from moving in the direction opposite to the direction in which the first hook 32b projects. This prevents disengagement of the second engaging portion 32 from the second engaged portion 45.

In the present example, when the circuit board 20 is held and fastened between the protection cover 30 and the battery holder 40, the second hooks 32c of the protection cover 30 temporarily fasten the circuit board 20 to the protection cover 30. Thus, the protection cover 30 may be coupled to the battery holder 40 with the circuit board 20 temporarily fastened to the protection cover 30. This facilitates the coupling of the circuit board 20 to the protection cover 30 and the battery holder 40.

The second hooks 32c of the engaging portions 32 project toward the corresponding end surfaces 20a of the circuit board 20. This further reduces the size of each engaging portion 32.

If, for example, the first and second hooks 32b, 32c of each engaging portion 32 are all configured to project toward the corresponding end surface 20a of the circuit board 20, the first and second hooks 32b, 32c need to be arranged next to one another on the engaging portion 32. This increases the size of each engaging portion 32. In this regard, in the present example, while the first hooks 32b project in the direction extending along the end surface 20a of the circuit board 20, the second hooks 32c project toward the end surface 20a of the circuit board 20. This restricts the first hooks 32b from occupying the circuit area 20c of the circuit board 20 and also limits increases in the size of the engaging portion 32. However, obtainment of the engaging portion 32 including the above first and second hooks 32b, 32c is difficult when engagement hooks that engage with the battery holder are configured to project toward the battery holder such as that described in Japanese Laid-Open Patent Publication No. 2013-19224.

Referring to FIG. 6 (left enlarged perspective view and right enlarged perspective view), when each engaging portion 32 engages the corresponding engaged portion 45, the outer wall of the extension 32a of the engaging portion 32 is partially fitted into the corresponding slit 44.

This fastens the battery holder 40 to the protection cover 30 in a firmer manner at positions where the slits 44 are located. Additionally, the slits 44 allow the engaging portions 32 to be located closer to the walls 42. This enlarges the circuit area 20c without increasing the sizes of the protection cover 30 and the battery holder 40.

The first embodiment has the advantages described below.

(1) The first hooks 32b of the engaging portions 32 project in the direction extending along the corresponding end surfaces 20a of the circuit board 20. This structure prevents the first hooks 32b from occupying the circuit area 20c of the circuit board 20 as compared to a structure in which engagement hooks that engage with the battery holder project toward the battery holder, or the circuit board, (e.g., structure in Japanese Laid-Open Patent Publication No. 2013-19224). Thus, even when the engaging portions 32 and the walls 42 are located at a further inner side toward the circuit board 20, the circuit area 20c is ensured in the circuit board 20. This reduces the sizes of the protection cover 30 and the battery holder 40 without reducing the space of the circuit area 20c.

(2) The protection cover 30 includes the first engaging portions, each of which includes a plurality of first hooks 32b, and the second engaging portions, each of which includes a single first hook 32b. In this structure, the number of the first hooks 32b is optimized in accordance with the position of each engaging portion 32. This optimizes the shapes of the protection cover 30 and the battery holder 40.

(3) The first engaging portions 32 are located in the periphery of the protection cover 30 at the straight portions. The second engaging portions 32 are located in the periphery of the protection cover 30 at the corners. Different engaging portions 32 (first engaging portions 32, second engaging portions 32) are arranged just by adjusting the number of first hooks 32b in accordance with the position of each engaging portion 32. This structure limits complication of the structures of the protection cover 30 and the battery holder 40.

(4) The outer wall of each second engaging portion 32 (extension 32a) is partially covered by the thick portion 46 located at the side of the second engaging portion 32 opposite to the side where the first hook 32b is located. Thus, the thick portion 46 prevents the second engaging portion 32 from moving in the direction opposite to the direction in which the first hook 32b projects. This prevents disengagement of the second engaging portion 32 from the second engaged portion 45 at the corner of the protection cover 30.

(5) Each engaging portion 32 includes the one or two first hooks 32b, which project in the direction extending along the corresponding end surface 20a of the circuit board 20, and the second hook 32c, which projects toward the circuit board 20. Thus, the engaging portion 32 having the temporary fastening function (second hook 32c) and the main fastening function (first hook 32b) may be formed in a smaller size.

(6) When each engaging portion 32 engages the corresponding engaged portion 45, the outer wall of the extension 32a of the engaging portion 32 is partially fitted into the corresponding slit 44. This fastens the battery holder 40 to the protection cover 30 in a firmer manner. Additionally, the slits 44 allow the engaging portions 32 to be located closer to the walls 42. This enlarges the circuit area 20c without increasing the sizes of the protection cover 30 and the battery holder 40. In other words, the slits 44 allow the walls 42 to be located closer to the circuit board 20. This reduces the sizes of the protection cover 30 and the battery holder 40 without reducing the space of the circuit area 20c.

Second Embodiment

A second embodiment of a portable device will now be described. The same reference characters are given to those components that are the same as the corresponding components of the first embodiment. Such components will not be described in detail.

Figure 8:
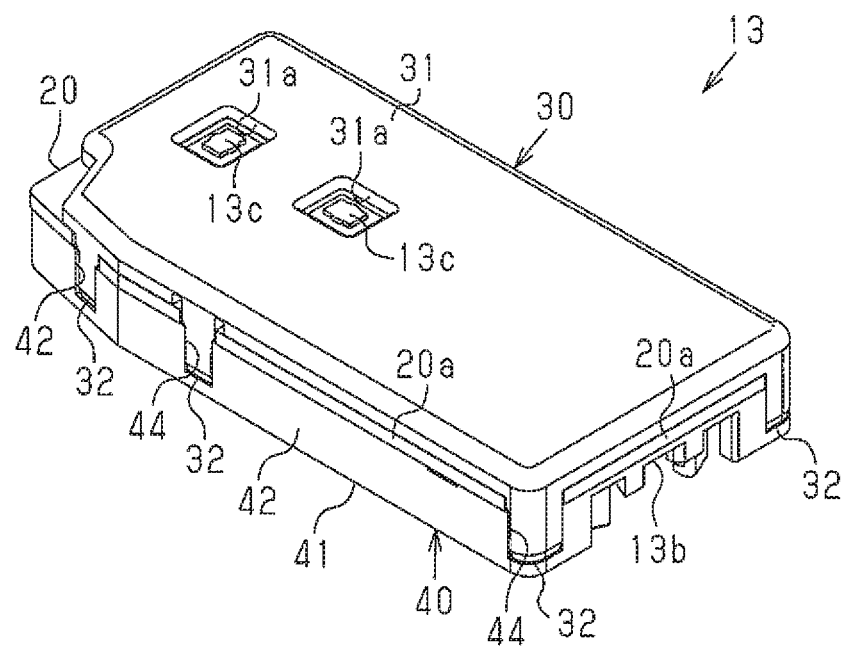
FIG. 8 is a perspective view illustrating a board unit of the second embodiment.

As illustrated in FIGS. 7A to 7E, in the second embodiment, the walls 42 of the battery holder 40 are free from the thick portions 46 of the first embodiment. More specifically, the walls 42 include a flat surface having no irregularities. Thus, as illustrated in FIG. 8, in the board unit 13, the walls 42 of the battery holder 40 (end surfaces of plate 41) are flush with the corresponding end surfaces 20a of the circuit board 20 and the corresponding end surfaces of the protection cover 30 (end surfaces of plate 31). The battery holder 40, the circuit board 20, and the protection cover 30 have the same size in a plan view.

Additionally, as illustrated in FIG. 8, when the circuit board 20, the protection cover 30, and the battery holder 40 are unitized as the board unit 13, the outer wall of the extension 32a of each of the first engaging portions and the second engaging portions is entirely exposed to the exterior through the corresponding slit 44. The outer wall of each extension 32a is flush with the corresponding wall 42 of the battery holder 40 (corresponding end surface of plate 41), the corresponding end surface 20a of the circuit board 20, and the corresponding end surface of the protection cover 30 (corresponding end surface of plate 31). The first hooks 32b of the engaging portions 32, that is, the engagement states of the first hooks 32b with the hook catches 45b, are concealed by the walls 42.

The second embodiment has the advantages described below in addition to advantages (1) to (3), (5), (6) of the first embodiment.

(7) The second embodiment is configured not to include the thick portions 46. Thus, the thickness of the walls 42, that is, the size of the battery holder 40, is reduced as compared to the first embodiment, which is configured to include the thick portions 46.

This reduces the size of the battery holder 40 while ensuring the space of the circuit area 20c. In other words, the circuit area 20c is enlarged without increasing the size of the battery holder 40.

(8) The outer wall of the extension 32a of each of the first engaging portions 32 and the second engaging portions 32 is flush with the corresponding wall 42 of the battery holder 40 (corresponding end surface of plate 41), the corresponding end surface 20a of the circuit board 20, and the corresponding end surface of the protection cover 30 (corresponding end surface of plate 31). Thus, when the protection cover 30 is fastened to the battery holder 40, there is no step between each engaging portion 32 and the corresponding engaged portion 45. This prevents unauthorized removal of the protection cover 30 from the battery holder 40 by inserting a tool such as a screwdriver into a gap formed between the protection cover 30 and the battery holder 40. Thus, unauthorized obtainment and tampering of the circuit board 20 are prevented. This increases the reliability of the electronic key.

It should be apparent to those skilled in the art that the foregoing embodiments may be employed in many other specific forms without departing from the scope of the invention. Particularly, it should be understood that the foregoing embodiments may be employed in the following forms.

The fitting portions of the walls 42 may be holes or grooves instead of the slits 44. In this case, advantage (6) is obtained as long as when the engaging portions 32 engage the engaged portions 45, the extensions 32a are partially fitted to the fitting portions (slits 44, holes, grooves, etc.) in the walls 42.

In the first embodiment, the thick portions 46 may be entirely or partially used to form the slits 44.

All of the engaging portions 32 do not necessarily have to include the second hooks 32c. The protection cover 30 may include, for example, engaging portions 32 that include the second hooks 32c and engaging portions 32 that do not include the second hooks 32c. In each of the above embodiments, each engaging portion 32 includes the single second hook 32c. However, any one of the engaging portions 32 may include two or more second hooks 32c. For example, while a first engaging portion 32 located in a straight portion (long side or short side) of the protection cover 30 includes two or more second hooks 32c, a second engaging portion 32 located in a corner of the protection cover 30 may include a single second hook 32c.

To temporarily fasten the circuit board 20 to the protection cover 30, when the circuit board 20 has a structure corresponding to the second hooks 32c of the engaging portions 32, the protection cover 30 may have a structure corresponding to the cutaway portions 20b of the circuit board 20. Alternatively, the circuit board 20 may be temporarily fastened to the protection cover 30 and the battery holder 40 by fastening members such as screws and bolts. The circuit board 20 may be temporarily fastened to the battery holder 40.

The engaging portions 32 do not have to include the second hooks 32c. More specifically, the temporary fastening function may be omitted. In this case, the protection cover 30 is fastened to the battery holder 40 with the circuit board 20 held between the protection cover 30 and the battery holder 40.

Each engaging portion 32 may include a plurality of first hooks 32b. For example, in each of the above embodiments, instead of the second engaging portions 32, the first engaging portions 32 may be located in corners of the protection cover 30. When the protection cover 30 is coupled to the battery holder 40, this structure restricts separation and disengagement of the first engaging portions 32 located in the corners of the protection cover 30 from the first engaged portions 45. Hence, for example, in the first embodiment, the thick portions 46 may be omitted from positions corresponding to the corners of the protection cover 30. Alternatively, each engaging portion 32 may include a single first hook 32b. In the first embodiment, the outer wall of each engaging portion 32 (extension 32a) located at a long side of the protection cover 30 is partially covered by the thick portion 46. This limits separation of the engaging portion 32 even when each engaging portion 32 includes the single first hook 32b.

The protection cover 30 may include engaging portions 32 that include the first hooks 32b and engaging portions 32 that do not include first hooks 32b. Further, each engaging portion 32 may include three or more first hooks 32b. For example, when an engaging portion 32 that includes three or more first hooks 32b is located in a straight portion (long side or short side) of the protection cover 30, an engaging portion 32 that includes one or two first hooks 32b may be located in a corner of the protection cover 30.

In the first embodiment, the support portion that covers a portion of the outer wall of each second engaging portion 32 (extension 32a) may be a portion of the wall 42 instead of the thick portion 46. That is, the support portion may have the same thickness as the wall 42.

In the first embodiment, the entire outer wall of each second engaging portion 32 (extension 32a) may be concealed by the thick portion 46. This limits separation of the second engaging portion 32 from the second engaged portion 45 in a further favorable manner.

The circuit board 20, the protection cover 30, and the battery holder 40 may be circular in a plan view. In this case, each engaging portion 32 may include a plurality of first hooks 32b.

The circuit board 20, the protection cover 30, and the battery holder 40 may have different shapes in a plan view. For example, when the circuit board 20 is circular in a plan view, the protection cover 30 and the battery holder 40 may be rectangular in a plan view. Alternatively, when the circuit board 20 and the protection cover 30 are rectangular in a plan view, the battery holder 40 may be circular in a plan view.

The protection cover 30 may include only one engaging portion 32. In this case, only a hinge needs to be located at a position opposite to the position of the engaging portion 32 so that, for example, the protection cover 30 is pivotally supported by the battery holder 40 with the hinge.

The number of the switches 13c and the number of the pushing members 15 may be one or three or more. In this case, the number of the through holes 12a in the upper case 12 and the number of the through holes 31a in the protection cover 30 only need to be changed accordingly.

The electronic key (portable device) may be capable of opening and closing a sliding door of a vehicle in addition to the locking and unlocking of the doors of the vehicle. The application of the electronic key (portable device) is not limited to an electronic key for a vehicle. The electronic key (portable device) may be applied to an electronic key used for a house and capable of locking and unlocking a door of the house.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A portable device comprising:
a circuit board on which a circuit element is mounted;
a first member; and
a second member, wherein the circuit board is held and fastened between the first member and the second member, wherein
the first member includes a wall that extends toward the second member from the first member,
the second member includes an engaging portion, wherein the engaging portion includes an extension that extends toward the first member from the second member and a hook that projects from the extension,
the circuit board includes an end surface that defines an edge of the circuit board,
the extension is opposed to the end surface of the circuit board,
the hook projects from the extension in a direction that extends along the end surface of the circuit board, and
the portable device further comprises an engaged portion located along an inner side of the wall, wherein the engaged portion engages the engaging portion to fasten the first member to the second member.

2. The portable device according to claim 1, wherein
the engaging portion is one of a plurality of engaging portions included in the second member, and
the plurality of engaging portions include
a first engaging portion that includes the extension and a plurality of hooks that project from opposite sides of the extension in the direction that extends along the end surface of the circuit board, and
a second engaging portion that includes the extension and a single hook that projects from one side of the extension in the direction that extends along the end surface of the circuit board.

3. The portable device according to claim 2, wherein
the second member includes a rectangular periphery,
the first engaging portion is located in the periphery of the second member at a straight portion, and
the second engaging portion is located in the periphery of the second member at a corner.

4. The portable device according to claim 3, wherein
the wall of the first member includes a support portion that covers at least a portion of an outer wall of the second engaging portion located at the corner of the second member, and the hook of the second engaging portion and the support portion are located at opposite sides of the extension of the second engaging portion.

5. The portable device according to claim 1, wherein
the engaging portion further includes a temporary fastening hook projecting toward the end surface of the circuit board and configured to temporarily fasten the circuit board to the second member.

6. The portable device according to claim 1, wherein
the wall includes a slit that extends in a direction in which the extension extends, and a portion of the extension is fitted into the slit in a state in which the engaging portion engages the engaged portion.

* * * * *